United States Patent [19]

Teng et al.

[11] Patent Number: 5,714,305
[45] Date of Patent: Feb. 3, 1998

[54] OVERCOAT-RELEASING LAMINATE AND METHOD FOR THE MANUFACTURE THEREOF

[75] Inventors: Ganghui Teng, Bedford; Jiyue Yang, Burlington, both of Mass.

[73] Assignee: Polaroid Corporation, Cambridge, Mass.

[21] Appl. No.: 700,298

[22] Filed: Aug. 20, 1996

Related U.S. Application Data

[63] Continuation of Ser. No. 449,219, May 24, 1995, abandoned.

[51] Int. Cl.$^6$ .............................. G03C 1/805; B32B 1/04
[52] U.S. Cl. .................. 430/271.1; 430/256; 430/272.1; 430/273.1; 428/201; 428/411.1; 427/208.2; 427/208.8
[58] Field of Search .................... 430/253, 256, 430/271.1, 285.1, 273.1, 961, 272.1; 428/201, 411.1, 195; 427/505, 508, 595, 208.2, 412.5, 155

[56] References Cited

U.S. PATENT DOCUMENTS

| | | | |
|---|---|---|---|
| 4,623,676 | 11/1986 | Kistner | 522/15 |
| 5,486,397 | 1/1996 | Gordon et al. | 428/76 |

*Primary Examiner*—Thorl Chea
*Attorney, Agent, or Firm*—Renato M. de Luna

[57] ABSTRACT

A thermally-activatable overcoat-releasing laminate useful for the application of a protective overcoat onto a planar surface, such as a binary image surface on a peel-developed laminar imaging medium, is provided. The overcoat-releasing laminate comprises a durable layer and an adhesive layer firmly interconnected at an interface, the firm interconnection being resultant of polymerization of a photopolymerizable monomer by exposure to ultraviolet radiation. As effected by the firm interconnection, use of the overcoat-releasing laminate is characterized by reliable release of the protective overcoat from a carrier web.

18 Claims, 4 Drawing Sheets

OVERCOAT-RELEASING LAMINATE AND METHOD FOR THE MANUFACTURE THEREOF

This is a Continuation of application Ser. No. 08/449,219, filed May 24, 1995 which was abandoned.

FIELD OF THE INVENTION

The present invention relates generally to an overcoat-releasing laminate and a method for the manufacture thereof. In a particular product embodiment, the present invention relates to an overcoat-releasing laminate having a durable layer and an adhesive layer firmly interconnected at an interface, the firm interconnection being the result of polymerization of a photopolymerizable monomer by exposure to ultraviolet radiation.

BACKGROUND OF THE INVENTION

A thermally-imaged, laminar imaging medium is described in the embodiments disclosed in International Patent Application No. PCT/US87/03249 (Publication No. WO 88/04237) (Etzel), the disclosure being incorporated herein by reference. International Patent Application No. PCT/US87/03249 describes, in one embodiment, a thermal imaging medium and a process for forming an image in which a layer of a porous or particulate image-forming substance (preferably, a layer of carbon black) is deposited on a heat-activatable image-forming surface of a first web material (hereinafter the "first substrate"), the layer having a cohesive strength greater than its adhesive strength to the first sheet-like element. Portions of this thermal imaging medium are then exposed to brief and intense radiation (for example, by laser scanning), to firmly attach exposed portions of the image-forming surface to the first substrate. Finally, those portions of the image-forming substance not exposed to the radiation (and thus not firmly attached to the first substrate) are removed, thus forming a binary image comprising a plurality of first areas where the image-forming substance is adhered to the first substrate and a plurality of second areas where the first substrate is free from the image-forming substance. Hereinafter, this type of image will be called a "differential adhesion binary image", or just "binary image".

In a principal embodiment of the thermal imaging medium described in the aforementioned International Patent Application, the image-forming substance is covered with a second substrate so that the image-forming substance is confined between the first and second substrates. After imaging and separation of the unexposed portions of the image-forming substance (with the second substrate) from the first substrate, a pair of differential adhesion binary images each supported by a substrate is obtained. A first binary image comprises exposed portions of image-forming substance more firmly attached to the first substrate by heat activation of the heat-activatable image-forming surface. A second binary image comprises non-exposed portions of the image-forming substance carded or transferred to the second substrate.

The respective binary images obtained by separating the two substrates of an exposed thermal imaging medium having an image-forming substance confined therebetween may exhibit substantially different characteristics. Apart from being the imagewise "positive" or "negative" of an original, the respective images may differ in character. Differences may depend upon the properties of the image-forming substance, on the presence of the original layer(s) in the medium, and upon the manner in which such layers fail adhesively or cohesively upon separation of the substrates. Either of the pair of images may, for reasons of informational content, aesthetic or otherwise, be desirably considered the principal image, and the invention described herein provides utility with regard to both types of images.

The image-forming process described in the aforementioned International Patent Application can produce high quality, high resolution images. However, for certain applications, the binary images produced by this process may suffer from comparatively low image durability because, in the finished image, the porous or particulate image-forming substance, typically carbon black admixed with a binder, lies exposed on the surface of the transparent substrate, and may be smeared, damaged or removed by, for example, fingers or other skin surfaces (especially, if moist), solvents, or friction during manual or other handling of the image. Accordingly, protection of the exposed image surface of a binary image with a protective overcoat has been found desirable.

Methodology for protecting a binary image surface by the thermal transfer of a protective overcoat poses particular difficulties. As indicated above, image surfaces are often relatively fragile. Accordingly, especially for binary images developed and imaged to a high-resolution, heightened care must be exercised in ensuring that such resolution is not damaged by subsequent post-development lamination. Further, when used for medical diagnostic purposes, for example, optical performance requirements for a protective overcoat may become very stringent. For such uses, a desirable protective overcoat must provide desired protection without substantially interfering or otherwise degrading the optical performance of the underlying binary image. However, the requirements of durability and optical performance are often competing. For example, if the overcoat is too thick—although better durability may be obtained—optical distortion may result. But, if the overcoat is too thin—although perhaps fostering better optical performance—manufacture and wrinkle-free application can be complicated by the difficulty in handling extremely thin webs.

In light of the above, there is a need for means whereby a binary imaged medium may be durably protected without undesirable degradation of image quality. With regard to durability, the resulting protected image should be, for example, suitable for archival purposes, abrasion-resistant, tape-resistant, permit repeated solvent washings without risk of separating the durable layer from the underlying imaged transparency, and capable of maintaining the unitary integrity of the resultant protected image when cut into smaller units.

Previous efforts directed toward the protection of binary images emphasize utilization of a thermally-cured coating or layer. International Patent Application No. PCT/US91/08345 (published as WO 92/09930 on Jun. 11, 1992) (Fehervari, et al.), for example, sets forth a process for protecting a binary image by lamination thereto of a protective overcoat, the overcoat having a thermally-cured durable layer. Pending U.S. Pat. No. 5,501,940 (Bloom, et al.) filed May 20, 1993, also sets forth a process for protecting a binary image involving lamination thereto of a protective overcoat, the protective overcoat having a siloxane component incorporated into a thermally-cured durable layer. Pending U.S. Pat. Ser. No. 5,486,397 (Gordon, et al.) filed Apr. 29, 1994, sets forth a process for protecting a binary image by application thereto of a thermally-cured reflective protective overcoat.

Practice of the subject matter discussed in the aforementioned International Patent Application of Fehervari, et al., (and in the aforementioned United States Patent Applications of Bloom, et al., and Gordon, et al.) provides good results for the goals envisioned in each. Regardless, it will be appreciated that manufacture of an overcoat incorporating a thermally-curable durable layer formulation can be slow and inefficient, owing to the relatively moderate process rates associated with thermal curing. While certain thermally-curable durable layer formulations make use of "faster" (cf., more reactive) curable components, stability of the formulation (cf., shelf-life) is sacrificed. Accordingly, considerable interest is present in the development of an overcoat-releasing laminate having a durable layer, the durable layer prepared from a formulation curable by exposure to ultraviolet radiation. By such formulation, fast and efficient crosslinking at a relatively low curing temperature is achieved together with the additional accomplishment of generally good crosslinking density. Further, by the selection of appropriate photopolymerizable monomers—in view of the broad variety thereof—a practitioner is provided with wide latitude for tailoring the physical properties of the resultant overcoat-releasing laminate.

Despite its advantages, the provision of UV-cured thermal transfer overcoat is frustrated in part by the fugitive nature of photopolymerizable monomers. For example, in the manufacture of thermal transfer overcoats wherein a durable layer formulation is coated onto a release layer carried by a substrate, the photopolymerizable monomer will oftentimes permeate into the release layer. With migrant monomer in the release layer, subsequent curing of the durable layer formulation tends to incidentally modify the cohesivity and/or adhesivity of the release layer, thus contributing to potentially undesirable overcoat release properties An attempt to circumvent such problems is construed from the configuration of an abrasion-resistant protective laminate mentioned in U.S. Pat. No. 5,085,987 (Smith et al.). The protective laminate therein is recited as comprising a strippable carrier, an abrasion-resistant layer overlying the carrier, a structural interlayer overlying the abrasion-resistant layer, and an adhesive layer overlying the abrasion-resistant layer. To incorporate a "thin" abrasion-resistant layer into their laminate, Smith et al. propose a "wet lamination" process, possibly to maintain crosslinking density. To accommodate "wet lamination", Smith et al. suggest use of a subbed web (i.e., the aforementioned "strippable carrier") and the aforementioned "structural interlayer". The requirement of such components is perceived as limiting and deemed undesirable by the present applicants in consideration of the goals underlying the claimed subject matter.

Figure 5A:
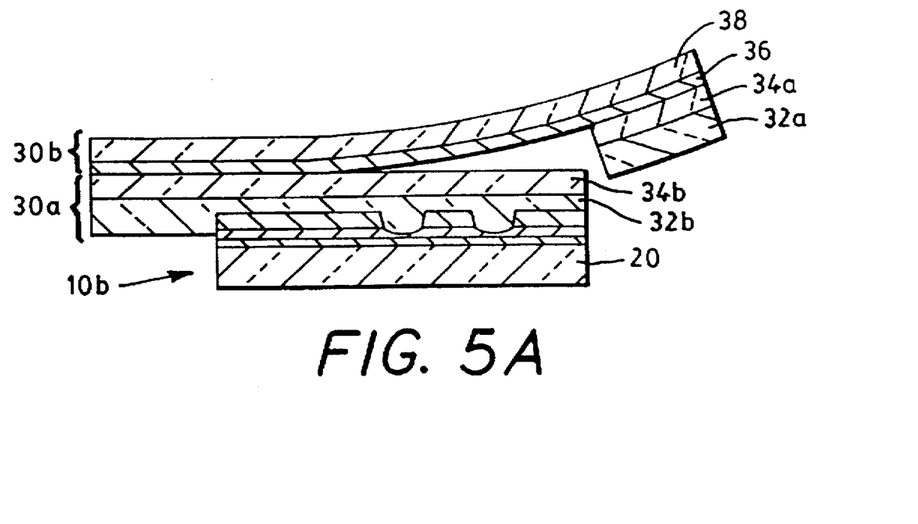
FIG. 5A schematically illustrates the "binary image/overcoat-releasing laminate" structure shown in FIG. 4, as a carrier web 38 used to carry the protective overcoat 30a is successfully separated from the laminate in accordance with a goal of the present invention.
Figure 5B:
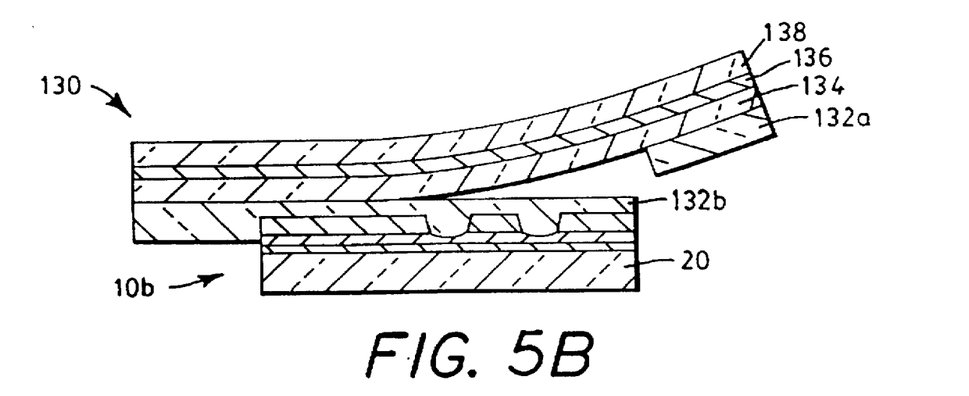
Figure 6:
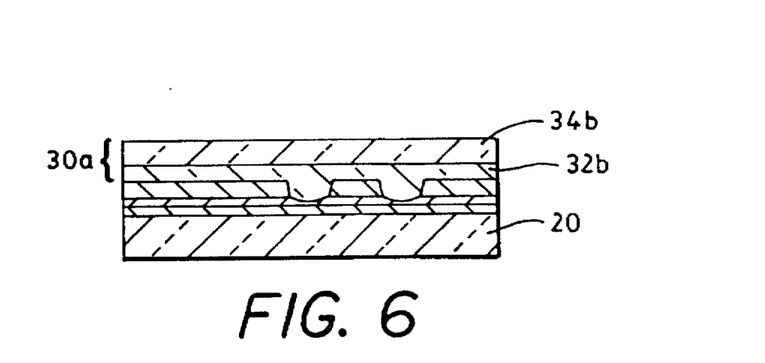
FIG. 6 schematically illustrates a protected binary image produced after complete removal of the carrier web 30b.

It is further noted that undesired separation may be observed in the use of laminar products which release a durable layer prepared by UV curing. Such laminar products are typically prepared by coating the UV-curable layer onto a carrier web, curing the layer by subjection to UV irradiation and, then, coating the cured layer with an adhesive to facilitate adhesion to the surface to be protected. Oftentimes during use, removal of the carrier web results in unintended separation between the adhesive layer and the durable layer. See FIG. 5A, and cf. FIG. 5B. As shown in FIG. 5B, undesired separation at such interface results in the retention of durable layer 134 on carrier web 138 and the transfer to binary image 10b of only adhesive layer 132. Where such undesired separation occurs, transfer of the protective overcoat is incomplete and protective functionality is lost.

SUMMARY OF THE INVENTION

It has been found that by curing a UV-curable durable layer formulation after deposition of an overlying adhesive layer formulation thereon, a "firm interconnection" therebetween is obtained, thereby reducing the frequency of separation at the interface between the durable layer and the adhesive layer. While the inventors do not wish to be limited to any theory in explanation of this result, it is believed that curing of the deposited UV-curable durable layer formulation after deposition of an overlying subsequent layer formulation (hereinafter, referred to sometimes as "post-curing") permits an "entanglement" of the polymeric component in the durable layer with material in the subsequent layer, thus, providing good interfacial adhesion.

In this light, the present invention provides an overcoat-releasing laminate useful for the application of a protective overcoat onto a substantially planar surface, such as, for example, a binary image surface obtained from a peel-developed laminar imaging medium. The overcoat-releasing laminate is characterized by a durable layer and an adhesive layer firmly interconnected at an interface, the firm interconnection being the result of polymerization of a photopolymerizable monomer by exposure to ultraviolet radiation.

More particularly, the overcoat-releasing laminate—capable of being thermally applied onto a substantially planar surface and separated to effect transfer thereto of a protective overcoat—comprises a carrier web comprising a flexible sheet material and a release layer, and a transferable protective overcoat comprising a durable layer and an adhesive layer.

The release layer—disposed between the durable layer and the carrier web—is configured such that, upon thermal application of the overcoat-releasing laminate onto a planar surface, interfacial separation between the durable layer and carrier web can be accomplished by adhesive or cohesive failure of the release layer.

The adhesive layer is capable of being thermally activated to thereby effect thermal application of the overcoat-releasing laminate onto the substantially planar surface. The application of the overcoat-releasing laminate results in an adhesive force greater than the affinity of the protective overcoat to the carrier web, and whereby the adhesive force is sufficient to effect failure of the release layer when the overcoat-releasing laminate is separated.

The durable layer is incorporated into the overcoat-releasing laminate from a photocurable composition. The photocurable composition comprises a macromolecular organic binder and a photopolymerizable monomer. The photocurable composition is formulated such that it is capable of being cured by polymerization of said photopolymerizable monomer by exposure to ultraviolet radiation. In the manufacture of an embodiment of the overcoat-releasing laminate, the durable layer is cured subsequent to the incorporation of the overlying adhesive layer. By such "post-curing", the photopolymerizable monomer diffuses and interacts with the components of the adhesive layer such that when the monomer is photopolymerized by ultraviolet irradiation, polymeric entanglement or interpenetration will occur at the interface between the durable layer and the adhesive layer. The durable layer and the adhesive layer may be characterized as being firmly interconnected at their interface, the firm interconnection being resultant of said photopolymerization of said photopolymerizable monomer. By the firm interconnection, release of said overcoat is reliably effected. Due to the high cross-linking densities afforded by UV-curing, the cured durable layer further displays enhanced impermeability to solvents and adhesive components in tape, and accordingly manifests both good solvent resistance and tape resistance.

The overcoat-releasing laminate of the invention is set apart from conventional, thermally-cured thermal transfer overcoats in several material respects.

First, different from conventional durable layer formulations, which are believed to contain typically only polymeric components, the durable layer of the overcoat-releasing laminate of the invention contains both a polymeric resin and a photopolymerizable (preferably multifunctional) monomer, and can be thereby crosslinked to form an interlaminar polymeric network when exposed to ultraviolet radiation.

Second, the overcoat-releasing laminate is prepared in a process wherein the durable layer formulation is cured after deposition of a subsequent overlying layer, such as an adhesive layer. The process allows interfacial entanglement of the polymer chains in both layers, resulting in the aforementioned interlaminar polymeric network. In contrast, the process of depositing an adhesive layer onto a "pre-cured" durable layer results in comparatively weaker adhesion between the two layers due to the generally impermeable nature of the highly crosslinked durable layer.

Third, unlike most commercial coating formulations wherein small molecular weight monomers are generally incorporated as adhesion promoters, the preferred durable layer formulation herein generally do not contain a monomer with a molecular weight less than approximately 290 g/mole. Smaller molecular weight monomers are more "fugitive", and thereby, may penetrate to a greater degree into the release layer ultimately frustrating the thermal transfer of the protective overcoat.

In light of the above, a principal objective toward which the present invention is directed is the provision of an overcoat-releasing laminate useful for the application of a protective overcoat onto a substantially planar surface.

Another objective toward which the present invention is directed is the provision of an overcoat-releasing laminate having a durable layer, the durable layer prepared from a UV-curable formulation and post-cured by exposure to ultraviolet radiation.

Another objective toward which the present invention is directed is the provision of an overcoat-releasing laminate comprising a durable layer and an adhesive layer firmly interconnected at an interface.

Another objective toward which the present invention is directed is the provision of an overcoat-releasing laminate comprising a durable layer and an adhesive layer firmly interconnected at an interface, the durable layer prepared from a formulation containing a photopolymerizable monomer, the firm interconnection being resultant of the polymerization of the photopolymerizable monomer by exposure to ultraviolet radiation.

Another objective toward which the present invention is directed is the provision of an overcoat-releasing laminate, an embodiment of which consists essentially of a carrier web, a "post-UV-cured" durable layer, and an adhesive layer. Comparative thinness and ease of manufacture are accomplished by the embodiment.

Another objective toward which the present invention is directed is the provision of a method for the manufacture of an overcoat-releasing laminate, the overcoat-releasing laminate characterized by a durable layer and an adhesive layer (or other overlying layer) firmly interconnected at an interface.

Another objective toward which the present invention is directed is the provision of a method for the manufacture of an overcoat-releasing laminate, the overcoat-releasing laminate comprising a durable layer and an adhesive layer firmly interconnected at an interface, the method involving the preparation of the durable layer from a formulation comprising a photopolymerizable monomer, the method involving the polymerization of the photopolymerizable monomer by exposure to ultraviolet radiation subsequent to the deposition of an adhesive layer formulation over the deposited durable layer formulation, whereby said firm interconnection is effected.

BRIEF DESCRIPTION OF THE DRAWINGS

For comparison, FIG. 5B schematically illustrates an unsuccessful transfer of an overcoat onto a binary image 10b observed in certain conventional methodologies, the unsuccessful transfer being resultant of undesirable adhesive failure occurring at an interface between a conventional durable layer 134 and a conventional adhesive layer 132.

DETAILED DESCRIPTION OF THE INVENTIVE SUBJECT MATTER

By the present invention, there is provided an overcoat-releasing laminate capable of being applied thermally onto a planar surface (e.g., a visually flat, uniform, or sheet-like surface) and of being separated therefrom, with transfer of a protective overcoat to said planar surface. In a principal application of the invention, the overcoat-releasing laminate is used to provide a protective overcoat on a binary image surface of a peel-developed laminar imaging medium.

In general, in an embodiment, the overcoat-releasing laminate comprises a carrier web and a transferable protective overcoat. The carrier web comprises a flexible base and a release layer. The transferable protective overcoat comprises a layer of adhesive (e.g., a hot-melt or heat-activatable adhesive) and a durable layer. The durable layer is based on a UV-cured formulation. In the manufacture of the overcoat-releasing laminate, the durable layer from which the durable layer formulation is obtained is provided initially in a solution state, then dried to achieve a "low tack", "semi-solid", or otherwise "non-liquid" state (i.e., preferably dry to the touch), and subsequently cured by exposure to ultraviolet radiation after the deposition of an overlying layer formulation (e.g., an adhesive layer formulation) thereon.

Figure 3:
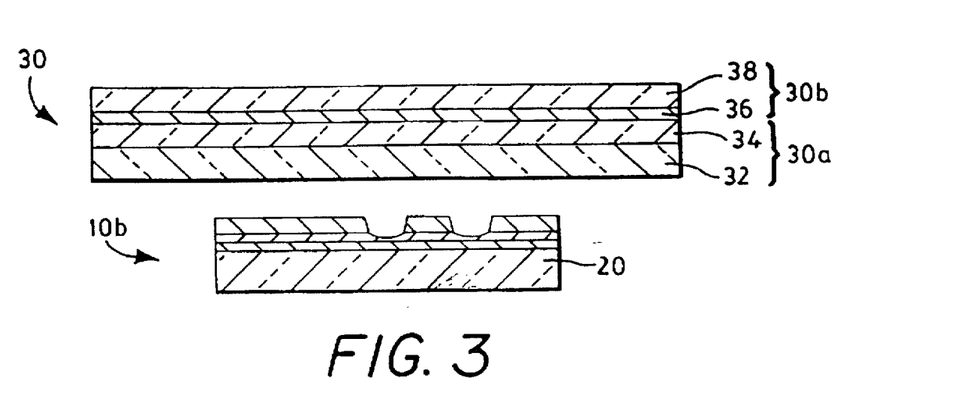
FIG. 3 schematically illustrates one of the binary images 10b shown in FIG. 2 and an overcoat-releasing laminate 30 carrying therein a transferable protective overcoat 30a according to a representative embodiment of the present invention.

A desirable configuration for an overcoat-releasing laminate is schematically illustrated in FIG. 3. In the overcoat-releasing laminate 30 shown therein, a release layer 36 (of carrier web 30b) is disposed between UV-cured durable layer 34 (of transferable protective overcoat 30a) and flexible base 38 (also of carrier web 30b). Release layer 36 is configured such that, upon thermal lamination of overcoat-releasing laminate 30 onto a planar surface (cf., the image surface of binary image 10b), interfacial separation between the durable layer 34 and carrier web 30b can be reliably accomplished by adhesive or cohesive failure of release layer 36. As more fully described below, release layer 36 can be prepared from wax, silicone or a combination of the two, and is deposited, for example, onto an untreated polyester base (cf., flexible base 38) from an aqueous emulsion.

UV-cured durable layer 34 is incorporated into overcoat-releasing laminate 30 from a photocurable composition. The photocurable composition comprises a macromolecular organic binder and a photopolymerizable monomer and is capable of being cured by polymerization of said photopolymerizable monomer by exposure to ultraviolet radiation. As an important feature of the present invention, durable layer 34 is firmly interconnected to an adhesive layer at an interface, the firm interconnection being resultant of photopolymerization of said photopolymerizable monomer. The presence of a firm interconnection (cf., an interlaminar polymeric network) may be comparatively inferred from the quantifiably better release performance of an overcoat-releasing laminate prepared in accordance with the description set forth herein. In particular embodiments of the present invention, the UV-cured durable layer is prepared from a formulation containing a polymeric resin of "medium molecular weight", a multifunctional monomer, a reactive surfactant, a photosensitizer, and a photoinitiator.

The adhesive layer 32 used in overcoat-releasing laminate 30 is one capable of being thermally activated to thereby effect thermal application (i.e., lamination) of overcoat-releasing laminate 30 onto a planar surface, and wherein said thermal application results in adhesion at an adhesive force greater than the affinity of the durable layer 34 to the carrier web 30b, and whereby said adhesive force is sufficient to effect adhesive or cohesive failure of the release layer 36 when the overcoat-releasing laminate 30 is interfacially separated. As more fully describe below, the adhesive layer 32 may be prepared from any of a variety of known adhesive compositions, but preferably is configured as a hot-melt adhesive layer prepared from, for example, polyvinylidene chloride, polyurethane, or acrylics.

Figure 4:
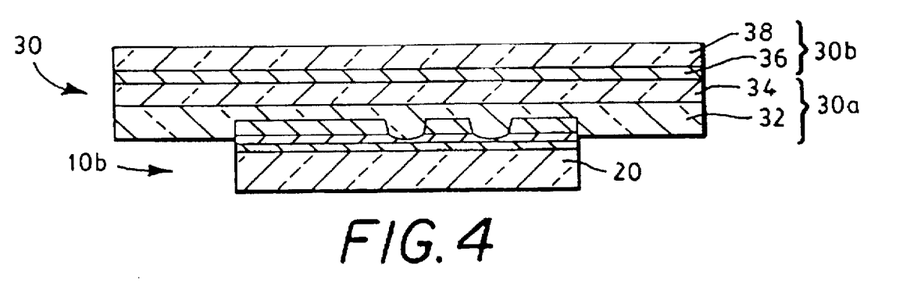
FIG. 4 schematically illustrates the binary image 10b and the overcoat-releasing laminate 30 shown in FIG. 3 after application onto an image surface of the binary image.

As shown in FIG. 4, use of the overcoat releasing laminate 30 initially involves lamination thereof onto a binary image 10b, preferably with the periphery of overcoat releasing laminate 30 extending beyond the periphery of the binary image 10b. Subsequently, the overcoat releasing laminate 30 is interfacially separated. As seen in FIG. 5A, in peripheral portions of overcoat-releasing laminate 30 where the protective overcoat 30a is not attached to binary image 10b, peripheral portions 34a and 32a of the protective overcoat 30a, remain attached to the carrier web 38, while the central portions 34b and 32b remain attached to binary image 10b, with adhesive layer 32 and the durable layer 34 breaking substantially along the periphery, thereby providing "clean" images to the protected binary image. Depending upon the nature of the release layer 36, none, part, or all of the release layer may remain with the central portions 32b and 34b of the adhesive layer 32 and durable layer 34 on the image 10b. In the embodiment illustrated in the drawings, the central portions 32b of the adhesive layer 32 and the durable layer 34 respectively (together with any release layer 36 remaining therewith) form a durable coating over the image 10b.

In addition to its product aspects, by the present invention there is further provided a method for making either a "clear overcoat"-releasing laminate or "reflective overcoat"-releasing laminate.

According to a first step of the method, a liquid release layer formulation is deposited onto a carrier web, the carrier web comprising a flexible sheet material. The liquid release layer formulation is then allowed to dry to form a dry release layer on the carrier web. The release layer formulation is configured such that upon drying, the resultant dry release layer will be substantially insoluble in a liquid durable layer formulation used in the following step.

According to a second step of the method, said liquid durable layer formulation is deposited onto the dry release layer. The durable layer formulation is a photocurable composition comprising a macromolecular organic binder and a photopolymerizable monomer. The photocurable composition is configured such that it can be cured by polymerization of the photopolymerizable monomer upon exposure to ultraviolet radiation. The durable layer formulation is configured such that upon suitable conditions, the liquid durable layer formulation may be dried to form a "semi-solid", "low tack", or otherwise "non-liquid" durable layer overlying the release layer.

According to a third step of the method, at least one liquid overlying layer formulation is applied onto the dry durable layer and, allowed to dry to form a dry overlying layer. If a "clear overcoat"-releasing laminate is desired, a liquid adhesive layer formulation may be selected as said liquid overlying layer formulation. If a "reflective overcoat"-releasing laminate is desired, a liquid reflective layer formulation and a liquid adhesive layer formulation may be selected as liquid overlying layer formulations. In either case, the liquid overlying layer formulation is configured such that, upon deposition onto the dry durable layer, monomer in the durable layer may diffuse, penetrate, or otherwise migrate into the deposited adhesive layer formulation.

According to a fourth step of the method, the dry durable layer is exposed to ultraviolet radiation through at least one dry overlying layer. By such "post-curing" it is believed that resident polymeric components in the durable layer become "enmeshed" or "networked" with migrant polymeric components in the overlying layer. The resulting firm interconnection contributes to an adhesion between the interfacing layers greater than the adhesive and cohesive forces associated with the release layer.

The carrier web 38 of the overcoat-releasing laminate 30 may be formed from any material which can withstand the conditions which are required to laminate the transfer sheet to the imaged transparency and which is sufficiently coherent and adherent to the protective overcoat 30a to permit displacement of the carrier web 38 away from the protected binary image after lamination, with removal of those portions, if any, of the protective overcoat 30a which extend beyond the periphery of the substrate. Typically, the carrier web 38 is a plastic film. Polyester (especially poly(ethylene terephthalate)) films are preferred. A film with a thickness in the range of about 0.5 to about 2 mil (13 to 51 µm) has been found satisfactory. If desired, the carrier web 38 may be treated with a subcoat or other surface treatment, such as will be well known to those skilled in the coating art in view of the present disclosure, to control its surface characteristics, for example to increase or decrease the adhesion of the durable layer or other layers (see below) to the carrier web 38.

The durable layer 34 of the transferable protective overcoat can be formed from any UV-curable composition which confers the desired properties upon the durable layer formed on the image. In general, it is preferred that the durable layer not have a thickness greater than about 10 μm, and most desirably, in the range of 2 to 6 μm. The durable layer should of course be resistant to materials with which it is likely to come into contact, including materials which may be used to clean the image. Although the exact materials which may contact the image will vary with the intended use of the protected image, in general it is desirable that the material for the durable layer be substantially unchanged by contact with water, isopropanol, and petroleum distillates. Preferably, the durable layer should be resistant to any other materials with which it may come into contact, for example, accidental spills of coffee, which have a very deleterious effect on some plastics.

In terms of its configuration, a UV-curable durable layer formulation useful for the present invention comprises a macromolecular binder and photopolymerizable monomer.

Among useful macromolecular binders are: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose esters and ethers (e.g., cellulose acetate butyrate, cellulose acetate propionate, and methyl, ethyl benzyl cellulose); synthetic rubbers (e.g., butadiene/acrylonitrile copolymers; chlorinated isoprene and 2-chloro-1,3-butadiene polymers); polyvinylesters (e.g., vinyl acetate/acrylate copolymers, poly(vinyl acetate) and vinyl acetate/methylmethacrylate copolymers); acrylate and methacrylate copolymers (e.g., polymethylmethacrylate); vinyl chloride copolymers (e.g., vinyl chloride/vinylacetate copolymers); and diazo resins such as the formaldehyde polymers and copolymers of p-diazo-diphenylamine. Preferred polymers will have a molecular weight of greater than approximately $1.0 \times 10^6$ g/mol. A polymethylmethacrylate binder (e.g., Elvacite 2010 and 2021, both available from du Pont) is presently preferred.

As to the photopolymerizable monomer component of the durable layer formulation, preferred monomers are those that may be appropriately characterized as bulky (e.g., having a molecular weight of greater than approximately 300 g/mol.) and polyfunctional (i.e., having more than one polymerizable ethylenically unsaturated double bond). Among the groups of monomers that may be considered are cycloaliphatic epoxy-based monomers, acrylated urethane-based monomers, acrylated epoxy-based monomers, and acrylic acrylates. The following Table A provides a comparative analysis of these monomer groupings:

TABLE A

General Performance Comparison of Photopolymerizable Monomer Categories

| Formulation | Cure Rate | Solvent Resistance | Abrasion Resistance | Shelf-Life |
|---|---|---|---|---|
| Cycloaliphatic Epoxy | fast | good | good | short |
| Acrylated Urethane | moderate | good | good | long |
| Acrylated Epoxy | fast | good | good | long |
| Acrylic Acrylate | fast | good | good | long |

Mixtures of two or more monofunctional monomers, of two or more polyfunctional monomers, and of two or more other ethylenically unsaturated monomers can also be used as desired. Particularly desirable high molecular weight monomers are trimethylolpropane triacrylate, OTA-480 (a glycerol derivative trifunctional acrylate commercially available from Radcure), tripropylene glycol diacrylate, pentaerythritol triacrylate, and trimethylolpropane ethoxy triacrylate. Pentaerythritol triacrylate is presently preferred.

To make the durable layer formulation curable by exposure to ultraviolet radiation, UV-activated photoinitiators and optional sensitizers are included in the durable layer formulation. Useful photoinitiators are those having a light absorption spectrum that overlaps an emission line of a predetermined source of ultraviolet radiation, and generally having an excited state wherein an electron is promoted to a higher orbital. Among useful photoinitiators are butyl benzoin ether, isobutyl benzoin ether, ethyl benzoin ether, propyl benzoin ether, benzophenone, benzil ketals, benzoin, acetophenone (such as 2,2-dimethoxy-2-phenylacetophenone), dimethyl quinoxiline, 4,4'-bis (dimethylamino) benzophenone, ketocoumarin (such as 3-benzoyl-7-methoxy coumarin), xanthone, thioxanthone, alkyl-substituted anthraquinone, diaryl iodonium salt, triaryl sulfonium salts, azobisisobutyro-nitrile, azo-bis-4-cyanopentoic acid, and the like. Such photoinitiators may be used singly or in combination. Preferred photoinitiators are Irgacure 651 (2,2-dimethoxy-2-phenylacephenone, available from Ciba-Geigy) and Irgacure 184 (1-hydroxycyclohexyl phenyl ketone, also available from Ciba-Geigy). Useful photosensitizers are those that have strong UV absorption characteristics at a longer wavelength, and that are capable of exciting the initiator through an electron transfer reaction. Preferred photosensitizers are ITX (a mixture of 2- and 4-isomers of isopropyl thioxanthone, available from Biddle-Sawyer) and CPTX (1-chloro-4-propoxythioxanthone-1-chloro-4-propoxy-9H-thioxanthone-9-one, also available from Biddle-Sawyer).

It has been found that the protection of the image conferred by the durable layer 34 is increased when the durable layer 34 has high lubricity. In part depending on the end use of the overcoat-releasing laminate, a wax, a solid silicone, and/or a silicone surfactant may be included in the durable layer to increase the lubricity of this layer.

To produce a smooth, thin durable layer 34, it is convenient to form the durable layer 34 in situ by forming the necessary polymerizable mixture, spreading a layer of the mixture upon the support layer, and—subsequent to the application of the adhesive layer 32—subjecting the layer 34 of the mixture to conditions effective to cause polymerization to form the firm interconnection between the durable layer 34 and the adhesive layer 32, provided of course that the polymerization technique used is one which can be practiced under these conditions.

The properties of the durable layer 34 transferred onto the surface of a binary image 10b are not necessarily the same as those of the durable layer 34 in the overcoat-releasing laminate 30, since the physical and/or chemical properties of the durable layer 34 may be changed during the lamination step. For example, the durable layer 34 of the overcoat-releasing laminate 30 may optionally comprise a latex having a plurality of discrete particles which coalesce during the lamination, thereby forming a continuous durable layer 34 on the image.

It will be appreciated that in positioning the overcoat-releasing laminate 30 onto binary image 10b prior to lamination thereto, the transferable protective overcoat 30b may extend beyond the periphery of the binary image 10b at one or more points. When carrier web 30a is peeled away, "excess" overcoat 30b extending beyond the periphery of binary image 10b remains attached to carrier web 30a; and durable layer 34 breaks substantially along the periphery of the binary image 10b. By using an overcoat-releasing laminate 30 larger in both dimensions than the binary image 10b to be protected, and arranging the overcoat-releasing laminate 30 so that it extends beyond the periphery of the binary image 10b all around the binary image 10b, one avoids any need to achieve accurate registration of the transferable protective overcoat with the image and also ensures that no part of the image goes unprotected. To ensure that the durable layer 34 breaks accurately along the periphery of the binary image 10b, thereby providing a flush edge on the resultant protected image, the durable layer 34 may comprise a continuous phase and a particulate solid dispersed in the continuous phase, since the presence of such a solid provides failure nuclei and thus assists accurate breakage of the transferable protective overcoat. A preferred particulate solid for this purpose is magnesium silicate.

According to the present invention, the overcoat-releasing laminate 30 will additionally comprise a release layer 36 interposed between the durable layer 34 and the carrier web 38, this release layer 36 being such that, in the areas where the durable layer 34 remains attached to the image, separation of the durable layer 34 from the carrier web 38 occurs by failure within or on one surface of the release layer 36. The release layer 36 is preferably formed from a wax, or from a silicone. A comparison of various of such materials is provided in the following Table B.

As will be apparent to those skilled in the art, in some cases part or all of the release layer 36 may remain on the surface of the durable layer 34 after the carrier web 30b has been removed therefrom. It will be appreciated that some transferable protective overcoats will release cleanly from a carrier web 30b without the need for a separate release layer 36, and such layer—as presently believed—may be accordingly omitted.

The overcoat-releasing laminate 30 of the present invention further comprises an adhesive layer 32 disposed on the surface of the durable layer 34 remote from the flexible base 38 so that, during the lamination, the durable layer 34 is adhered to the surface of the binary image 10b by the adhesive layer 32. The use of an adhesive layer is desirable to achieve strong adhesion between the image and the protective overcoat 30a and/or to lower the temperature needed for lamination. Different types of adhesive can be used to form the adhesive layer. For example, the adhesive layer can be formed from a thermoplastic adhesive having a glass transition temperature in the range of about 50° to about 120° C. (in which case the lamination is effected by heating the adhesive layer above its glass transition temperature); an ultraviolet curable adhesive (in which case the lamination is effected by exposing the adhesive layer to ultraviolet radiation, thereby curing the adhesive layer); or a pressure sensitive adhesive having an adhesion to steel of about 22 to about 190 grams per millimeter (in which case the lamination is effected simply by pressure).

Further, it will be appreciated that for application onto the binary image 10b mentioned herein, "haze" will oftentimes be a factor to be considered in the configuration of the adhesive layer 32. Reduction of "haze"—an artifact generally attributed to the scattering of light by an optically heterogeneous interface—may be effected by matching the refractive indices of both the adhesive layer and the generally light-transmissive release coat 16a on binary image 10b. Most durable aromatic thermoplastic polymers desirable for use in an adhesive layer will generally have relatively high refractive indices (e.g., 1.5 to 1.70). Difficulties arise due to the relatively low refractive indices (e.g., 1.45 to 1.47) often found in desirable configurations of release layer 16a. To overcome such difficulties, it will be noted that the high refractive indices of aromatic polymers can be accounted to the high π electron densities presented by the aromatic double bonds. Accordingly, a cycloaliphatic-based polymer

TABLE B

General Performance
Comparison of Release Layer Formulation

| Release | Tradename | Solvent Resist. | Scar Resist. | | Tape Resistance | | |
|---|---|---|---|---|---|---|---|
| | | | 10N | 20N | 0 | 5 | 30 |
| Silicone | Release Int'l (Med. Release) | pass | 10/10 | 3/5 | Pass | Pass | Fail |
| Silicone | Release Int'l (Easy Release) | pass | 10/10 | 4/5 | Pass | Pass | Pass |
| Silicone | Costume C&L 7000 | pass | 10/10 | 5/5 | Pass | Pass | Pass |
| Silicone | Costume C&L 5018 | pass | 10/10 | 5/5 | Pass | Pass | Pass |
| Silicone | Costume C&L 5030 | pass | 10/10 | 5/5 | Pass | Pass | Fail |
| Polypropylene | Lamart | pass | 10/10 | 5/5 | Pass | Pass | Pass |
| Wax | Allied Signal (AC-32535) | pass | 10/10 | 2/5 | Pass | Pass | Pass |

Among other materials useful in release layer 36 are those listed below for possible use in release layer 16 of laminar imaging medium 10. A preferred release layer 36 is made from the above-listed [oxidized polyethylene] wax from Allied-Signal.

(i.e., having no double bonds in its rings) will generally have good durability and a desirably matching low refractive index. An adhesive layer utilizing one of such species, i.e., cyclohexyl polyester (Bostik-SY-4 and -SY-5), is shown in the following Table C as possessing both good durability and a desirable refractive index.

TABLE C

General Performance Comparison of Materials For Adhesive Layer Formulations

| Material Tradename | Lamination Temp. (±5° F.) | Refractive Index | D-min Haze | Durability Test (crock #) |
|---|---|---|---|---|
| None | 315 | 1.00 (Air) | 36.4 | Very Low |
| None | 315 | 1.00 | 35.8 | Very Low |
| Bostik 7942 | 315 | 1.55 | 7.3 | >125 |
| Bostik 7942 | 315 | 1.55 | 7.4 | >125 |
| Bostik 7942 | 350 | 1.55 | 7.7 | >125 |
| Bostik-SY-4 | 315 | 1.51 | 4.2 | >125 |
| Bostik-SY-5 | 315 | 1.51 | 5.1 | >125 |
| P&S J-9184AF | 315 | 1.51 | 4.1 | 50–125 |
| Morton 37P-295 | 315 | 1.50 | 4.4 | 50–125 |
| Morton 50C-12 | 315 | 1.49 | 3.9 | 30–125 |
| Whitaker AF109 | 315 | 1.49 | 3.4 | 30–125 |

Notes: Bostik 7942 is an aromatic polyester manufactured by Bostik, Inc.; P&S J-9184AF is a solvent-based ethyl vinyl acetate manufactured by Pierce & Stevens Corp.; Morton 37P-295 and 50C-12 are water-based ethyl acrylic acrylate manufactured by Morton International; Whitaker AF109 is a water-based ethyl acrylic acrylate manufactured by Whitaker Corp. Durability was tested on a Crock Meter fitted with a 410–450 g, 3-mil radius stainless steel head reciprocating at 2¹/₁₆".

In light of these results, for the provision of protective overcoats in general wherein low refractive index is desired, a "cyclohexyl polyester"-based adhesive layer (among other cycloaliphatic polymers) should be considered.

In the practice of the method for making a "reflective overcoat"-releasing laminate, reflective functionality of the transferable reflective overcoat is provided by incorporation therein of an opaque area. In the preferred embodiment, the opaque area is a blanketwise uniform reflective layer (not shown) deposited between the durable layer 34 and the adhesive layer 32. While thickness may vary among different applications, it is preferred that the reflection layer not have a thickness greater than about 10 μm, and most desirable this thickness is in the range of 2 to 6 μm. It will be appreciated that the thickness of the reflective layer (and durable layer as indicated below) will generally be much thinner than a substrate 20 of the binary image 10b.

The reflective layer can be prepared from any number of materials that are compatible with the other layers of the "reflective overcoat"-releasing laminate and which will provide reflective functionality. Such will be known to those skilled in the art in light of the present disclosure. Regardless, in a principal configuration, the reflection layer formulation comprises a dispersal of highly reflective (white) pigments (most preferably based on titanium dioxide) in a suitable macromolecular binder. Reflective pigments that can be used include: zinc oxide, zinc sulfide, lead carbonate, carbon white (i.e., fluorinated carbon black), polymers with encapsulated air voids, calcium carbonate, calcium sulfate, antimony oxide, magnesium carbonate, strontium sulfate, barium sulfate, barium carbonate, calcium silicate, and silicon oxide. Macromolecular binders that may be considered for use would include the same species used for the durable layer. Depending on the binder and reflective pigment utilized, the reflective layer formulations may also include surfactants, dispersal agents, and/or plasticizers.

When used for the above described binary image, the reflection layer should effect a reflection $D_{min}$ of approximately 0.12 to 0.16 in areas without image carbon, a reflection $D_{max}$ of approximately 2.2 and a reflective layer transmission density of about 0.64. It will be appreciated that in certain embodiments, transmission density is such that the protectively reflected image may be viewable as a transmitted image on, for example, a light box, while viewable as a reflective image under normal ambient lighting conditions.

While the overcoat-releasing laminate 30 described herein is preferred for the surface application and protection of binary images, its utility extends to the application onto other types of images, such as those produced by, for example, thermal transfer systems (such as sublimation transfer and melt transfer); printing systems (such as offset printing), laser ablation, ink jet recording systems, static toner systems, and the like. Further, non-image surfaces can also benefit from application thereto of a protective overcoat made in accordance with the present invention, the only desirable requirement being that the surface is substantially planar.

As to the underlying binary image 10b—application onto which is a principal objective of the present invention—description shall be made, by way of illustration, with reference to the accompanying drawings.

Figure 1:
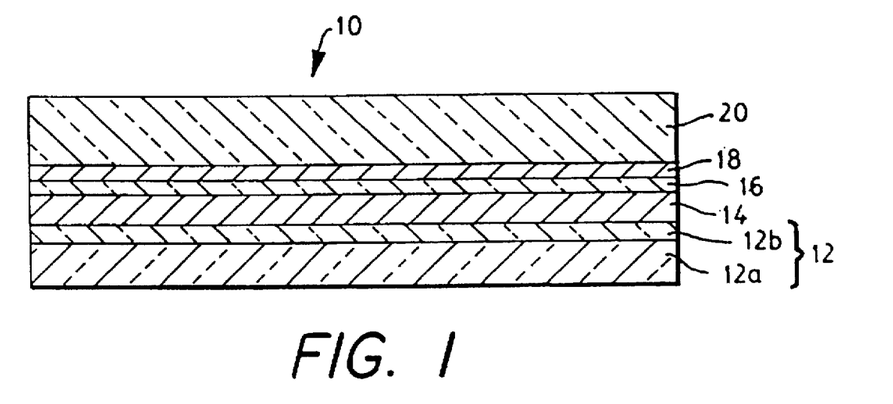
FIG. 1 of the accompanying drawings schematically illustrates in cross-section a laminar imaging medium embodiment of a type described in the International Patent Application No. PCT/US87/03249 (Publication No. WO 88/04237).
Figure 2:
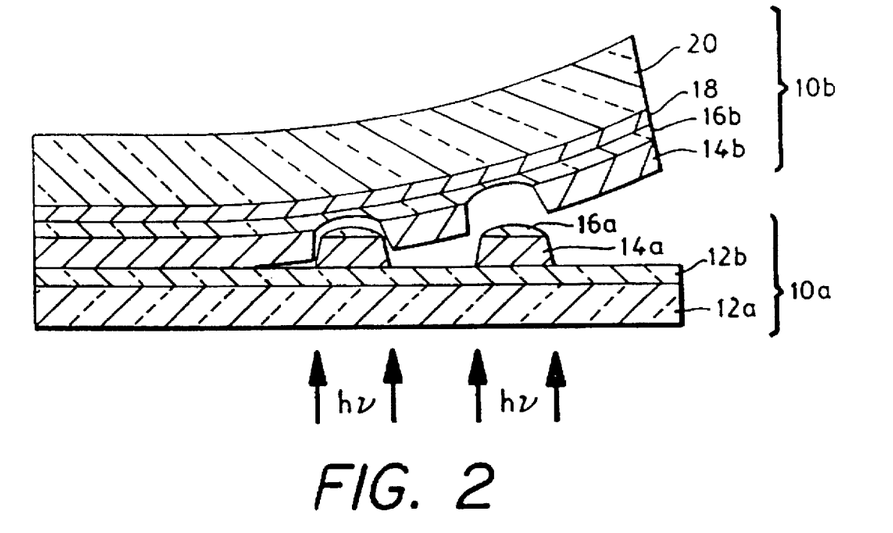
FIG. 2 schematically illustrates the laminar imaging medium shown in FIG. 1 after imagewise exposure as first and second elements thereof are being separated to form a pair of complementary binary images.

In FIG. 1, them is shown a thermal imaging laminar medium 10 suited to use in the production of a pair of binary images, shown as binary images 10a and 10b in a state of partial separation in FIG. 2. Thermal imaging medium 10 includes a first sheet-like web material 12 having superposed thereon, and in order, porous or particulate image-forming layer 14, release layer 16, adhesive layer 18 and second sheet-like web material 20. Upon exposure of the thermal imaging medium 10 to radiation, exposed portions of image-forming layer 14 are attached firmly to sheet-like web material 12, so that, upon separation of the respective sheet-like web materials, as shown in FIG. 2, a pair of binary images, 10a and 10b, is provided. The nature of the layers of thermal imaging medium 10 and their properties are importantly related to the manner in which the respective images are partitioned from the thermal imaging medium after exposure. The various layers of thermal imaging medium 10 are described in detail hereinafter.

In a representative embodiment useful in practice of the present invention, sheet-like web material 12 comprises a transparent material through which imaging medium 10 can be exposed to radiation. Web material 12 can comprise any of a variety of transparent sheet-like materials, although transparent polymeric sheet materials will be especially preferred. Among preferred web materials are polystyrene, polyester (desirably, poly(ethylene terephthalate)), acrylic polymers (for example poly(methyl methacrylate), polyethylene, polypropylene, poly(vinyl chloride), polycarbonate, poly(vinylidene chloride), cellulose acetate, cellulose acetate butyrate, and copolymeric materials such as the copolymers of styrene, butadiene, and acrylonitrile, including poly (styrene- co-acrylonitrile).

The surface of web material 12 is important to the thermal imaging of medium 10. At least a surface zone or layer of web material 12 comprises a polymeric material which is heat activatable upon subjection of medium 10 to brief and intense radiation, so that, upon rapid cooling, exposed portions of the surface zone or layer are firmly attached to image-forming layer 14. According to the representative embodiment, web material 12 comprises a portion 12a, of a web material such as poly(ethylene terephthalate), having a surface layer 12b of a polymeric material that can be heat activated at a temperature lower than the softening temperature of portion 12a. A suitable material for surface layer 12b comprises a polymeric material which tends readily to soften so that exposed portions of layer 12b and layer 14 can be firmly attached to web 12. A variety of polymeric materials can be used for this purpose, including polystyrene, poly (styrene-co-acrylonitrile), poly(vinyl butyrate), poly(methyl methacrylate), polyethylene and poly(vinyl chloride).

The employment of a thin surface layer 12b on a substantially thicker and durable web material 12a permits desired handling of web material 12 and desired imaging efficiency. It will be appreciated, however, that web 12 can comprise a unitary sheet material (not shown) provided that, upon exposure of the medium to radiation and absorption of light and conversion to heat, the web material and particularly the surface portion or zone thereof adjacent layer 14 can be made to firmly attach to the image-forming material of layer 14.

In general, the thickness of web material 12 will depend upon the desired handling characteristics of medium 10 during manufacture, on imaging and post-imaging separation steps and on the desired and intended use of the image to be carded thereon. Typically, web material 12 will vary in thickness from about 0.5 to 7 mils (13 to 178 μm). Thickness may also be influenced by exposure conditions, such as the power of the exposing source of radiation. Good results can be obtained using a polymeric sheet having a thickness of about 0.75 mil (0.019 mm) to about two mils (0.051 mm) although other thicknesses can be employed.

Where surface zone 12b of web material 12 comprises a discrete layer of polymeric material, layer 12b will be very thin and typically in the range of about 0.1 to 5 μm. The use of a thin layer 12b facilitates the concentration of heat energy at or near the interface between layers 12b and 14 and permits optimal imaging effects and reduced energy requirements. It will be appreciated that the sensitivity of layer 12b to heat activation (or softening) and attachment or adhesion to layer 14 will depend upon the nature and thermal characteristics of layer 12b and upon the thickness thereof. Good results are obtained using, for example, a web material 12 having a thickness of about 1.5 to 1.75 mils (38 to 44 μm) carrying a surface layer 12b of poly(styrene-co-acrylonitrile) having a thickness of about 0.1 to 5 μm. Other web materials can, however, be employed.

A discrete layer 12b of heat-activatable material can be provided on a web material 12a by resort to known coating methods. For example, a layer of poly(styrene-co-acrylonitrile) can be applied to a web 12a of poly(ethylene terephthalate) by coating from an organic solvent such as methylene chloride. If desired, web material 12a can contain additional subcoats (not shown) such as are known in the art to facilitate adhesion of coated materials. If desired, an additional compressible layer (not shown) having stress-absorbing properties can be included in medium 10 as an optional layer between web material 12a and surface layer 12b. Such optional and compressible layer serves to absorb physical stresses in medium 10 and to prevent undesired delamination at the interface of layer 12b and layer 14. Inclusion of a compressible layer facilitates the handling and slitting of medium 10 and permits the conduct of such manipulatory manufacturing operations as may otherwise result in stress-induced delamination. A thermal imaging medium incorporating a stress-absorbing layer is described and claimed in U.S. Pat. No. 5,200,297, issued to Neal F. Kelly on Apr. 6, 1993.

Image-forming layer 14 comprises an image-forming substance deposited onto layer 12b as a porous or particulate layer or coating. Layer 14, referred to as a colorant/binder layer, can be formed from a colorant material dispersed in a suitable binder, the colorant being a pigment or dye of any desired color, and preferably, being substantially inert to the elevated temperatures required for thermal imaging of medium 10. Carbon black is a particularly advantageous and preferred pigment material. Preferably, the carbon black material will comprise particles having an average diameter of about 0.01 to 10 μm. Although the description hereof will refer principally to carbon black, other optically dense substances, such as graphite, phthalocyanine pigments, and other colored pigments can be used. If desired, substances which change their optical density upon subjection to temperatures as herein described can also be employed.

The binder for the image-forming substance of layer 14 provides a matrix to form the porous or particulate substance thereof into a cohesive layer and serves to adhere layer 14 to layer 12b. Layer 14 can be conveniently deposited onto layer 12b using any of a number of known coating methods. According to a preferred embodiment, and for ease in coating layer 14 onto layer 12b, carbon black particles are initially suspended in an inert liquid vehicle (typically, water) and the resulting suspension or dispersion is uniformly spread over layer 12b. On drying, layer 14 is adhered as a uniform image-forming layer onto the surface of layer 12b. It will be appreciated that the spreading characteristics of the suspension can be improved by including a surfactant, such as ammonium perfluoroalkyl sulfonate, nonionic ethoxylate, or the like. Other substances, such as emulsifiers can be used or added to improve the uniformity of distribution of the carbon black in its suspended state and, thereafter, in its spread and dry state. Layer 14 can range in thickness and typically will have a thickness of about 0.1 to about 10 μm. In general, it will be preferred, from the standpoint of image resolution, that a thin layer be employed. Layer 14 should, however, be of sufficient thickness to provide desired and predetermined optical density in the images prepared from imaging medium 10.

Suitable binder materials for image-forming layer 14 include gelatin, poly(vinyl alcohol), hydroxyethyl cellulose, gum arabic, methyl cellulose, polyvinylpyrrolidone, polyethyloxazoline, and poly(styrene-co-maleic anhydride). The ratio of pigment (e.g., carbon black) to binder can be in the range of from 40:1 to about 1:2 on a weight basis. Preferably, the ratio of pigment to binder will be in the range of from about 4:1 to about 10:1. A preferred binder material for a carbon black pigment material is polyvinyl alcohol.

If desired, additional additives or agents can be incorporated into image-forming layer 14. Thus, submicroscopic particles, such as chitin, polytetrafluoroethylene particles and/or polyamide and/or polystyrene latex can be added to colorant/binder layer 14 to improve abrasion resistance. Such particles can be present, for example, in amounts of from about 1:2 to about 1:20, particles to layer solids, by weight.

As can be seen from FIG. 2, the relationships of adhesivity and cohesivity among the several layers of imaging medium 10 are such that separation occurs between layer 14 and surface zone or layer 12b in non-exposed regions. Thus, imaging medium 10, if it were to be separated without exposure, would separate between surface zone or layer 12b and layer 14 to provide a $D_{max}$ on sheet 20. The nature of layer 14 is such, however, that its relatively weak adhesion to surface zone or layer 12b can be substantially increased upon exposure. Thus, as shown in FIG. 2, exposure of medium 10 to brief and intense radiation in the direction of the arrows and in the areas defined by the respective pairs of arrows, serves in the areas of exposure to substantially lock or attach layer 14, as portions 14a, to surface zone or layer 12b.

Attachment of weakly adherent layer 14 to surface zone or layer 12b in areas of exposure is accomplished by absorption of radiation within the imaging medium and conversion to heat sufficient in intensity to heat activate surface zone or layer 12b and on cooling to more firmly join exposed regions or portions of layer 14 and surface zone or layer 12b. Thermal imaging medium 10 is capable of absorbing radiation at or near the interface of surface zone or layer 12b of heat-activatable polymeric material and layer 14. This is accomplished by using layers in medium 10 which by their nature absorb radiation and generate the requisite heat for desired thermal imaging, or by including in at least one of the layers, an agent capable of absorbing radiation of the wavelength of the exposing source. Infrared-absorbing dyes can, for example, be suitably employed for this purpose.

Porous or particulate image-forming layer 14 can comprise a pigment or other colorant material such as carbon black which is absorptive of exposing radiation and which is known in the thermographic imaging field as a radiation-absorbing pigment. While a radiation-absorbing pigment in layer 14 may be essentially the only absorber of radiation in medium 10, inasmuch as a secure bonding or joining is desired at the interface of layer 14 and surface zone or layer 12b, it is preferred that a light-absorbing substance be incorporated into either or both of layer 14 and surface zone or layer 12b.

Suitable light-absorbing substances in layers 12b and/or 14, for converting light into heat, include carbon black, graphite or finely divided pigments such as the sulfides or oxides of silver, bismuth or nickel. Dyes such as the azo dyes, xanthene dyes, phthalocyanine dyes or the anthraquinone dyes can also be employed for this purpose. Especially preferred are materials which absorb efficiently at the particular wavelength of the exposing radiation. In this connection, infrared-absorbing dyes which absorb in the infrared-emitting regions of lasers which are desirably used for thermal imaging are especially preferred. Suitable examples of infrared-absorbing dyes for this purpose include the alkylpyrylium-squarylium dyes, disclosed in U.S. Pat. No. 4,508,811, and including 1,3-bis[(2,6-di-t-butyl-4H-thiopyran-4-ylidene)methyl]-2,4-dihydroxy-dihydroxide-cyclobutene diylium-bis{inner salt}. Other suitable IR-absorbing dyes include 4-[7-(4H-pyran-4-ylide)hepta-1, 3,5-trienyl]pyrylium tetraphenylborate and 4-[[3-[7-diethhylamino-2-(1,1-dimethylethyl)-(benz[b]-4H-pyran-4-ylidene)methyl]-2-hydroxy-4-oxo-2-cyclobuten-1-ylidene] methyl]-7-diethylamino-2-(1,1-dimethylethyl)-benz[b] pyrylium hydroxide inner salt. Such IR-absorbing dyes are disclosed in, for example, U.S. Pat. No. 5,227,499, issued to D. A. McGowan et al. on Jul. 13, 1993, U.S. Pat. No. 5,262,549, issued to S. J. Telfer et al. on Nov. 16, 1993, and International Patent Application No. PCT/US91/08695 (Publication No. WO 92/09661).

As shown in FIG. 2, exposed regions or portions of layer 14 separate sharply from non-exposed regions. Layer 14 is an imagewise disruptible layer owing to the porous or particulate nature thereof and the capacity for the layer to fracture or break sharply at particle interfaces. From the standpoint of image resolution or sharpness, it is essential that layer 14 be disruptible, such that a sharp separation can occur between exposed and unexposed regions of the thermally imaged medium, through the thickness of the layer 14 and along a direction substantially orthogonal to the interface of the layers 14 and 12b, i.e., substantially along the direction of the arrows in FIG. 2.

Shown in imaging medium 10 is a second sheet-like web material 20 covering image-forming layer 14 through adhesive layer 18 and release layer 16. Web material 20 is laminated over image-forming layer 14 and serves as the means by which non-exposed areas of layer 14 can be carded from web material 12 in the form of image 10b, as shown in FIG. 2. Preferably, web material 20 will be provided with a layer of adhesive to facilitate lamination. Adhesives of the pressure-sensitive and heat-activatable types can be used for this purpose. Typically, web material 20 carrying adhesive layer 18 will be laminated onto web 12 using pressure (or heat and pressure) to provide a unitary lamination. Suitable adhesives include poly(ethylene-co-vinyl acetate), poly (vinyl acetate), poly(ethylene-co-ethyl acrylate), poly (ethylene-co-methacrylic acid) and polyesters of aliphatic or aromatic dicarboxylic acids (or their lower alkyl esters) with polyols such as ethylene glycol, and mixtures of such adhesives.

The properties of adhesive layer 18 can vary in softness or hardness to suit particular requirements of handling of the imaging medium during manufacture and use and image durability. A soft adhesive material of suitable thickness to provide the capability of absorbing stresses that may cause an undesired delamination can be used, as is disclosed and claimed in the aforementioned U.S. Pat. No. 5,200,297 to N. F. Kelly. If desired, a hardenable adhesive layer can be used and cutting or other manufacturing operations can be performed prior to hardening of the layer, as is described in International Patent Application No. PCT/US91/08585 (Publication No. WO 92/09411).

Preferred in the representative embodiment, and as shown in FIG. 1, release layer 16 is included in thermal imaging medium 10 to facilitate separation of images 10a and 10b according to the mode shown in FIG. 2. As described hereinbefore, regions of medium 10 subjected to radiation become more firmly secured to surface zone or layer 12b by reason of the heat activation of layer 12 by the exposing radiation. Non-exposed regions of layer 14 remain only weakly adhered to surface zone or area 12b and are carded along with web 20 on separation of web materials 12 and 20. This is accomplished by the adhesion of layer 14 to surface zone or layer 12b, in non-exposed regions, being less than: (a) the adhesion between layers 14 and 16; (b) the adhesion between layers 16 and 18; (c) the adhesion between layers 18 and 20; and (d) the cohesivity of layers 14, 16 and 18. The adhesion of web material 20 to porous or particulate layer 14, while sufficient to remove non-exposed regions of layer 14 from web surface zone or layer 12b, is controlled, in exposed areas, by release layer 16 so as to prevent removal of firmly attached exposed portions of layers 14a (attached to surface zone or layer 12b by exposure and by heat activation thereof). As discussed above, in binary image 10b, portions 16a—depending on the composition of release layer 16—may manifest a low refractive index. To prevent "haze" in non-image areas, a protective overcoat with appropriately matched refractive index should be considered.

Release layer 16 is designed such that its cohesivity or its adhesion to either adhesive 18 or porous or particulate layer 14 is less, in exposed regions, than the adhesion of layer 14 to surface zone or layer 12b. The result of these relationships is that release layer 16 undergoes an adhesive failure in exposed areas at the interface between layers 14 and 18, or at the interface between layers 16 and 14; or, as shown in FIG. 2, a cohesive failure of layer 16 occurs, such that portions (16b) are present in image 10b and portions (16a) are adhered in exposed regions to porous or particulate layer 14. Portions 16a of release layer 16 may serve to provide some surface protection for the image areas of image 10a, against abrasion and wear; however, the degree of protection provided by portions 16a is limited, and if image 10a is to be retained and used, in most cases it is advantageous to protect image 10a as is afforded (among other advantages) by use thereon of the present overcoat-releasing laminate.

Release layer 16 can comprise a wax, wax-like or resinous material. Microcrystalline waxes, for example, high-density polyethylene waxes available as aqueous dispersions, can be used for this purpose. Other suitable materials include carnauba, beeswax, paraffin wax, and wax-like materials such as poly(vinyl stearate), poly(ethylene sebacate), sucrose polyesters, polyalkylene oxides, and dimethylglycol phthalate. Polymeric or resinous materials such as polystyrene, poly(methyl methacrylate), and copolymers of methyl methacrylate and monomers copolymerizable therewith can be employed. If desired, hydrophilic colloid materials such as poly(vinyl alcohol), gelatin, or hydroxyethyl cellulose can be included as polymer binding agents.

Resinous materials, typically coated as latices, can be used and latices of poly(methyl methacrylate) are especially useful. Cohesivity of layer 16 can be controlled so as to provide the desired and predetermined fracturing. Waxy or resinous layers which are disruptible and which can be fractured sharply at the interfaces of particles thereof can be used to advantage. If desired, particulate materials can be added to the layer to reduce cohesivity. Examples of such particulate materials include, silica, clay particles, and particles of poly(tetrafluoroethylene).

Thermal imaging medium 10 can be imaged by creating (in medium 10) a thermal pattern according to the information imaged. Exposure sources capable of providing radiation which can be imaged onto medium 10, and which can be converted by absorption into a predetermined pattern, can be used. Gas discharge lamps, xenon lamps, and lasers are examples of such sources.

The exposure of medium 10 to radiation can be progressive or intermittent. For example, a two-sheet laminar medium, as shown in FIG. 1, can be fastened onto a rotating drum for exposure of the medium through web material 12. A light spot of high intensity, such as is emitted by a laser, can be used to expose the medium 10 in the direction of rotation of the drum, while the laser is moved slowly in a transverse direction across the web, thereby to trace out a helical path. Laser drivers, designed to fire corresponding lasers, can be used to intermittently fire one or more lasers in a predetermined manner to thereby record information according to an original to be imaged. As is shown in FIG. 2, a pattern of intense radiation can be directed onto medium 10 by exposure to a laser from the direction of the arrows, the areas between the pairs of arrows defining regions of exposure.

If desired, a thermal imaging medium of the invention can be imaged using a moving slit or stencils or masks, and by using a tube or other source which emits radiation continuously and which can be directed progressively or intermittently onto medium 10. Thermographic copying methods can be used, if desired. Further, with regard to imaged media onto which a reflective overcoat-releasing laminate will be employed, it will be appreciated that imaged material viewed by reflected light makes use of the image twice, and accordingly would require only about half the density needed for viewing by transmission. Suitable modifications to the imaging and development of the imaged media should be made accordingly.

Preferably, a laser or combination of lasers will be used to scan the medium and record information in the form of very fine dots or pels. Semiconductor diode lasers and YAG lasers having power outputs sufficient to stay within upper and lower exposure threshold values of medium 10 will be preferred. Useful lasers may have power outputs in the range of from about 40 milliwatts to about 1000 milliwatts. An exposure threshold value, as used herein, refers to a minimal power required to effect an exposure, while a maximum power output refers to a power level tolerable by the medium before "burn out" occurs. Lasers are particularly preferred as exposing sources inasmuch as medium 10 may be regarded as a threshold-type of film; i.e., it possesses high contrast and, if exposed beyond a certain threshold value, will yield maximum density, whereas no density will be recorded below the threshold value. Especially preferred are lasers which are capable of providing a beam sufficiently fine to provide images having resolution as free as 1,000 (e.g., 4,000 to 10,000) dots per centimeter.

Locally applied heat, developed at or near the interface of layer 14 and surface zone or layer 12$b$ can be intense (about 400° C.) and serves to effect imaging in the manner described above. Typically, the heat will be applied for an extremely short period, preferably of the order of <0.5 microsecond, and exposure time span may be less than one millisecond. For instance, the exposure time span can be less than one millisecond and the temperature span in exposed regions can be between about 100° C. and about 100020 C.

Apparatus and methodology for forming images from thermally actuatable media such as the medium of the present invention are described in International Patent Application No. PCT/US91/06880 of Polaroid Corporation.

The imagewise exposure of medium 10 to radiation creates in the medium latent images which are viewable upon separation of the sheets thereof (12 and 20) as shown in FIG. 2. Sheet 20 can comprise any of a variety of transparent plastic or other such materials, depending upon the particular application for image 10$b$. A transparent polyester (e.g., polyethylene terephthalate) sheet material is a preferred material for this purpose.

As already mentioned, separation of the sheets 12 and 20 produces a pair of complementary binary images, each of which comprises a plurality of first areas at which the imaging layer 14 is adhered to the underlying sheet 12 or 20 and a plurality of second areas at which the sheet 12 or 20 is free from the imaging layer 14. The first areas of the image on the sheet 12 comprise the areas covered by the portions 14$a$ of the imaging layer 14, while the second areas of the same image comprise the areas from which the portions 14$b$ of the imaging layer 14 have been removed. On the other hand, the first areas of the image on the sheet 20 comprise the areas covered by the portions 14$b$ of the imaging layer 14, while the second areas of the same image comprise the gaps left by the portions 14$a$ of the imaging layer 14 which remain on the sheet 12. The images on the sheets 12 and 20 are thus complementary, a white area in one image corresponding to a black area in the other. Either or both of these binary images may be protected by employment thereon of the overcoat-releasing laminate of the present invention. In FIGS. 3 to 5A, and related discussion above, the image on sheet 20 is shown being protected, but it will be appreciated that no significant changes in the use of the overcoat-releasing laminate are required to use the same process for the protection of the image on sheet 12.

Figure 7:
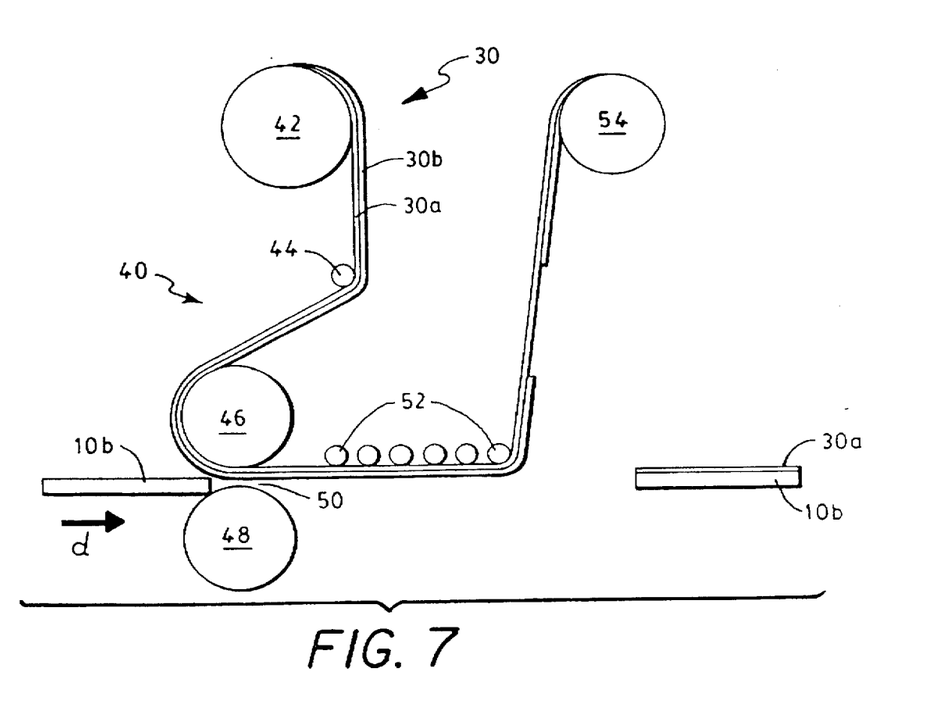
FIG. 7 schematically illustrates a side elevation of an apparatus 40 useful for applying onto a binary image 10b a protective overcoat 30a according to the present invention.

The transfer of a protective overcoat onto, for example, a binary image is preferably accomplished by lamination. FIG. 7 shows an apparatus 40 which may be used to carry out the lamination process of FIGS. 3 to 6. The apparatus 40 comprises a feed roll 42 on which is wrapped a supply of overcoat-releasing laminate 30 (which is shown in FIG. 7 as comprising transferable protective overcoat 30$b$ and carrier web 30$a$), a first guide bar 44 and a pair of electrically heated rollers 46 and 48 having a nip 50 therebetween. The rollers 46 and 48 are provided with control means (not shown) for controlling the temperature of the rollers and the force with which they are driven toward one another, and thus the pressure exerted in the nip 50. The apparatus 40 further comprises a series of second guide bars 52 and a take-up roll 54.

Overcoat-releasing laminate 30 is fed from the feed roll 42, around the guide bar 44 and into nip 50 trader a tension controllable by tension control means (not shown) provided on the feed roll 42 and/or the take-up roll 54. Contemporaneously, the binary image to be protected is fed (manually or mechanically), image surface side up, into the nip 50 below the overcoat-releasing laminate 30. For the reasons described above, the overcoat-releasing laminate 30 may be made wider than the binary image 10b so that excess overcoat-releasing laminate extends beyond both sides of the binary image 10b. The heat and pressure within the nip 50 laminate the binary image 10b to the overcoat-releasing laminate 30 and the two travel together beneath the guide bars 52. Because the thin overcoat-releasing laminate 30 is more flexible than the binary image 10b, this sharp bending of the overcoat-releasing laminate causes in the area where the overcoat-releasing laminate 30 overlie the binary image 10b, separation of the transferable protective overcoat 30a (layers 32 and 34 shown in the FIG. 3) from the carrier web 30b with the transferable protective overcoat 30a remaining attached to the binary image 10b, whereas in areas where the overcoat-releasing laminate 30 does not overlie the binary image 10b, the transferable protective overcoat 30a remains attached to the carrier web 30b. The spent overcoat-releasing laminate with areas of unused protective overcoat 30a remaining attached thereto are wound onto the take-up roll 54.

The following Examples are now provided, though by way of illustration only, to show details of known reagents, conditions, and techniques used in the manufacture and use of the present invention. All parts, ratios, and proportions, except where otherwise indicated, are by weight.

EXAMPLES

Preparation of a Thermal Imaging Medium and Processing Thereof to Provide a Binary Image "A"

A thermal imaging medium is prepared as follows:

Onto a first sheet of poly(ethylene terephthalate) of 1.75-mil (44 μm) thickness is deposited the following layers, in succession:

- a 0.5 μm thick heat-activatable layer of poly(styrene-co-acrylonitrile);
- a 0.8 μm thick layer of carbon black pigment and polyvinyl alcohol, at a weight ratio of 5:1 to thereby provide an optical density in excess of 4.0; and
- a 0.4 μm thick release layer comprising: ten parts high-density polyethylene wax (from AC-32535, a neutral wax dispersion); ten parts silica; and one part poly (styrene-co-maleic anhydride).

Onto a second sheet of poly(ethylene terephthalate) of 4-mil (102 μm) thickness is deposited a layer of heat-activatable adhesive, coated from a solution of a thermoplastic resin, available as Vitel PE-200 dispersion from Goodyear Chemicals Division of the Goodyear Tire and Rubber Company and having a sealing temperature of about 205° F. (90.6° C.), dissolved in methyl ethyl ketone and toluene. The layer on drying is 10 μm thick adhesive layer.

The aforementioned poly(ethylene terephthalate) sheet materials are brought into face-m-face superposition and passed through a pair of heated rolls at a temperature of about 190° F. (87.8° C.) to provide a laminar, thermally-actuatable imaging medium, having the structure shown in FIG. 1.

This laminar imaging element is then imaged by laser exposure (through the thinner of the polyester sheets thereof) using high intensity semiconductor lasers. In this regard, the laminar imaging element is fixed (clamped) to a rotary drum with the 4-mil polyester component thereof facing the drum. Radiation of semiconductor lasers is subsequently directed through the 1.75-mil polyester component thereof in an imagewise manner in response to a digital representation of an original image to be recorded in the thermally actuatable imaging element. After exposure to high-intensity radiation (the scanning of the imaging element conducted orthogonally to the direction of drum rotation) and removal of the thus-exposed imaging element from the drum, the respective sheets of the imaging elements are separated to provide a first image on the first 1.75-mil polyester sheet and a second and complementary image on the second 4-mil polyester sheet. This second image may be characterized as a black half-tone image having a visible optical density of 3.5 to 4.5.

Example 1

An overcoat-releasing laminate according to the present invention is made comprising a carrier web, a release layer, a durable layer, and an adhesive layer.

A sample formulation of the release layer is prepared according to the following Table 1A.

TABLE 1A

Preparation of Sample Release Layer Formulation

| Weight$^\alpha$ | Material$^\chi$ | Function | % Conc.$^\beta$ |
|---|---|---|---|
| 25.71 | AC-32535 | Wax | 0.857% |
| 14.40 | TX-100 | Surfactant | 0.48% |
| 2959.9 | Water | Solvent | — |

Notes: α: by weight; β: by weight; χ: AC-32535 (from Allied-Signal) is a non-ionic polyethylene emulsion; TX-100 (from Union Carbide) is an alkylphenol-ethylene oxide adduct.

The durable layer formulation is prepared by dissolving a polymer, a multifunctional monomer, additives, and a photoinitiator in an organic solvent, such as ethyl acetate or methylethylketone (MEK). A sample formulation of the durable layer is prepared according to the following Table 1B.

TABLE 1B

Preparation of Sample Durable Layer Formulation

| Weight$^\alpha$ | Material$^\chi$ | Function | % Conc.$^\beta$ |
|---|---|---|---|
| 16.00 | PMMA | Polymer Resin | 56.50 |
| 4.00 | TMPTA | Multifunctional Monomer | 30.44 |
| 1.00 | FX-189 | Reactive Surfactant | 4.35 |
| 1.00 | Ebecryl 350 | Reactive Surfactant | 4.35 |
| 0.50 | Irgacure 184 | Photoinitiator | 4.35 |
| 80.0 | MEK | Solvent | — |

Notes: α: by weight; β: by weight; χ: FX-189 (from 3M) is a fluorinated acrylate monomer, Ebecryl 350 (from Radcure) is functional silicone acrylate, and Irgacure 184 (from Ciba-Geigy) is 1-hydroxycyclohexyl phenyl ketone.

A sample formulation for the adhesive layer is prepared as shown in the following Table 1C.

TABLE 1C

Preparation of Sample Adhesive Layer Formulation

| Weight[α] | Material[χ] | Function | % Conc.[β] |
|---|---|---|---|
| 85.5 | PU-110 | Adhesive | 60% |
| 49.9 | BT-520 | Adhesive | 40% |
| 0.4 | FC-120 | Surfactant | — |

Notes: α: by weight; β: by weight; χ: PU-110 (from Miles) is a polyurethane emulsion, BT-520 (from Zeneca) is an acrylic emulsion, and FC-120 (from 3M) is a fluorinated surfactant.

A polyethylene terephthalate film (i.e., the "carrier web") with a wax coating layer of 0.02 μm (obtained from the formulation of Table 1A) is coated with the sample UV-curable durable layer formulation of Table 1B at a thickness of 2 μm, then coated with the sample adhesive layer formulation of Table 1C also at a thickness of 2 μm. Each layer is dried at 200° F. for 1 to 2 minutes. The three-layer structure is then irradiated by UV light at an intensity of 300 W/inch at a line speed of 30 ft./min. to produce an overcoat-releasing laminate.

The overcoat-releasing laminate is thermally-activated and applied with pressure onto a binary image (as prepared above) at 340° F. and a speed of about ½ in/sec. The pressure setting is 70 lb./in. The carrier web is then urged away (i.e., peeled away) from the binary image by a separate roller.

Evaluation

Samples of the protected binary image prepared according to Example 1 are evaluated under the following criteria:

Scratch Resistance Test: Scratch resistance is tested using a Shear/Scratch Tester, Teledyne Taber 502, according to the standard test of Federal Specifications L-F004508 and SST 307. The weight (force) at which a visible scratch appears in a protected binary image is recorded as a measure of the scratch resistance of the transferred protective overcoat.

Solvent Resistance Test: To quantify solvent resistance, a protected binary image sample is rubbed with a cotton pad wetted with any of a number of available commercial film cleaners (e.g., Anchor, Varn, and Hurst) and like solvents. The number of rubs at which any visible damage appears on the sample is recorded.

Tape-Tearing Resistance Test: To assess tape-tearing resistance, about 5 inches of 3M Ruby tape with a half inch width was manually pressed onto the protective overcoat surface of the protected binary image. The tape is then peeled from the protective overcoat surface at a controlled speed of approximately 500 ft./min. and at a constant angle of 90 degrees. Any visible defect in the protected binary image subsequent to such treatment is recorded as "Failure".

Results

In evaluating samples according to the criteria above, it was observed that overcoat-releasing laminates—prepared by the aforedescribed procedure—provide smooth thermal transfer of a protective overcoat onto an image surface of a binary image. In comparison to Control Samples 1 and 2 (i.e., binary image samples laminated with conventional thermal transfer overcoats), a binary image sample laminated with the protective overcoat as provided above had better scratch resistance, solvent resistance, and tape tearing resistance. Summarized results are quantified and tabulated in the following Evaluation Tables 1—1 and 1-2.

Evaluation TABLE 1-1

Comparative Evaluation of Protected Binary Image Samples Prepared In Accordance with Example 1

| Media Evaluated (Laminated @ 340° F.) | Scratch Resistance (grams) | Solvent Resistance[α] | | | Tape-Tearing Resistance | | |
|---|---|---|---|---|---|---|---|
| | | Anchor | Varn | <1 m. | 5 m. | 30 m. | 24 hrs |
| Control Sample 1[β] | 40 | 9 | 10 | P | P | P | F |
| Control Sample 2[β] | 40 | 22 | 25 | P | P | P | F |
| Example 1 | 90 | >50 | >50 | P | P | P | P |

Notes: α: Number of Double Rubs; β: Thermal transfer overcoat made by Dri-Print (composition unknown).

EVALUATION TABLE 1-2

Further Evaluation of Protected Binary Image Samples Prepared In Accordance with Example 1

| Media Evaluated (Laminated @ 315° F.) | Crock | | | | Solvent Resistance[α] | | Other | | |
|---|---|---|---|---|---|---|---|---|---|
| | $D_{Min}$ | $D_{Max}$ | CR. Load | F.N. | IPOH | Water | Litebox | Shatter | Sharpie |
| Control Sample[β] | >125 | >125 | >140 g | 0 | >40 | >40 | 20 | 10 | 10 |
| Example 1 | >125 | >125 | >170 g | 0 | >40 | >40 | 40 | 10 | 10 |

Notes:
α: Number of Double Rubs;
β: Thermal transfer overcoat made by Dri-Print (composition unknown).

Examples 2 and 3

Overcoat-releasing laminates are prepared as follows:

Onto an ICI 022C substrate (a 0.92-mil polyester-based substrate available from ICI) a waxy release layer, a durable layer, and an adhesive layer are applied. The release layer is made from AC 32535 (0.18%), a nonionic polyethylene emulsion, at a coating coverage of 2 mg./ft.$^2$ and drying conditions set at 30 sec. at 200° F. Two durable layer formulations are made according to Table 2, infra, with 20% total solid, coating coverage at 250 mg/ft$^2$ and drying conditions set at 1 min. at 250° F.

TABLE 2

Preparation of UV-Curable Durable Layer Formulation

| Component | Example 2 | Example 3 |
|---|---|---|
| Elvacite 2021 | — | 110 g |
| Elvacite 2010 | 110 g | — |
| Trimethylolpropane trimethacrylate, TMPTA | 55 g | — |
| Pentaerythritol triacrylate, PETA | 5 g | 55 g |
| SR399 | — | 5 g |
| Ebecryl 350 | 8 g | 8 g |
| Ebecryl 1360 | 2 g | 2 g |
| FX 189 | 10 g | 10 g |
| Irgacure 651 | 15 g | 15 g |
| ITX | 0.1–0.2 g | 0.1–0.2 g |
| MEK, Methyethylketone | 800 g | 800 g |

In Table 2, Elvacite 2021 (from E.I. du Pont de Nemour) is polymethylmethacrylate of "high" molecular weight, Elvacite 2010, (from E.I. du Pont de Nemours) is polymethylmethacrylate of "medium" molecular weight, SR 399 (from Sartomer) is dipentaerythritol pentaacrylate (a multifunctional monomer), Ebecryl 350 (from RadCure) is a difunctional silicone acrylate (a reactive surfactant), Ebecryl 1360 (from RadCure) is a hexafunctional silicone acrylate (a reactive surfactant), FX 189 (from 3M) is a reactive surfactant based on a fluorinated acrylate monomer, Irgacure 651 (from Ciba-Geigy) is 2,2-dimethoxy-2-phenylacephenone, and ITX (from Biddle-Sawyer) is a mixture of 2- and 4-isomers of isopropyl thioxanthone. The deposited, but yet uncured durable coating will be observed to be a non-tacky solid film. Such configuration is believed to prevent oxygen diffusion, and thereby reduce inhibition. Example 3—due to the higher concentration of functionality—will offer higher crosslinking density and more pronounced hardness.

The adhesive layer is formulated from polyurethane/ acrylics and Daran 8600c. The coating coverage is at 200 mg/ft$^2$. Drying conditions are set at 1 min. at 220° F. Daran 8600 (from Zeneca) is a polyvinylvinylidene chloride. Adhesion between the durable layer and adhesive layer is accomplished by a tow coating process and subsequent interlayer adhesion. The dried adhesive coating is also believed to block oxygen diffusion.

Evaluation

Compared to a current control, both UV-cured durable layers showed better scratch resistance and solvent resistance. Kinetic studies utilizing real FTIR demonstrated that the Irgacure 651/ITX system can cure the UV-durable formulation at a fast speed with low residual monomer concentrations.

Examples 4–7, Comparative Example 8–9

The following examples 4–7 (compared with Comparative Examples 8–9) relate to method aspects of the present invention. The method is illustrated by showing application thereof to the manufacture of the reflective protective overcoat, the particular overcoat having a durable layer post-cured by exposure to ultraviolet radiation.

Preparation of a Thermal Imaging Medium and Processing Thereof to Provide a Binary Image "B"

A thermal imaging medium is prepared as follows:

First, onto a first sheet of poly(ethylene terephthalate) of 1.75 mil (44 μm) thickness (ICI Type 3284 film, available from ICI Americas, Inc., Hopewell, Va.) are deposited in succession a 2.4 μm thick stress-absorbing layer of polyurethane (a mixture of 90% ICI Neotac R-9619 and 10% ICI NeoRez R-9637, both available from ICI Resins U.S. Wilmington, Mass.); a 1.3 μm thick heat-activatable layer of poly(styrene-co-acrylonitrile); a 1 μm thick layer of carbon black pigment, poly(vinyl alcohol) (PVA), 1,4-butanediol diglycidyl ether, and a fluorochemical surfactant (FC-171, available from the Minnesota Mining and Manufacturing Corporation, St. Paul, Minn. 55144-1000) at ratios, respectively of 5:1:0.18:0.005; a 0.6 μm thick release layer comprising polytetrafluoroethylene, silica, and hydroxyethylcellulose (Natrosol +330, available from Aqualon Incorporated, Bath, Pa. 18014), at ratios, respectively, of 0.5:1:0.1; and a 2.2 μm thick layer of Neocryl BT 520 copolymer (available from ICI Resins U.S.) containing acidic groups.

To form the second adhesive layer, 5 parts of butyl acrylate, 82 parts of butyl methacrylate, and 13 parts by weight of N,N-dimethylaminoethyl acrylate are copolymerized with AIBN (2,2' azobisizobutyronitrile) to form a copolymer having a number average molecular weight of about 40,000 and a glass transition temperature of +11° C. A coating solution is prepared comprising 11.90 parts of this copolymer, 2.82 parts of trimethylolpropane triacrylate (TMPTA, available as Ageflex TMPTA from CPS Chemical Company, Old Bridge, N.J. 08857), 0.007 parts of 4-methoxyphenol (a free radical inhibitor), 1.14 parts of 2,2-dimethoxy-2-phenyl-acetophenone (a photoinitiator, available as Irgacure 651 from Ciba-Geigy Corporation), 0.037 parts of tetrakis{methylene(3,5-di-tert-butyl-4-hydroxyhydro-cinnamate)}methane (an anti-oxidant, available as Irganox 1010 from Ciba-Geigy Corporation), 0.037 parts of thiodiethylene bis(3,5-di-tert-butyl-4 hydroxy) hydro-cinnamate (an anti-oxidant, available as Irganox 1035 from Ciba-Geigy), and 58.28 parts of ethyl acetate solvent. This coating solution is coated onto a 4 mil (101 μm) poly(ethylene terephthalate) film (ICI Type 527 anti-static treated film, available from ICI Americas, Inc., Hopewell, Va.; this film forms the second web of the imaging medium) and dried in an oven at about 85° C. (185° F.) to a coating weight of about 9400 mg/m$^2$ to form a hardenable second adhesive layer approximately 10 μm thick.

The first and second poly(ethylene terephthalate) sheets are immediately brought together with the adhesive layers in face-to-face contact, the 4 mil sheet being in contact with a rotating steel drum. A rubber roll having a Durometer hardness of 70–80 is pressed against the 1.75 mil sheet. The resulting web of laminar medium is then passed in line, approximately 30 seconds after lamination, under a radio-frequency-powered source of ultraviolet radiation, with the 4 mil sheet facing, and at a distance of about 2.5 inches (6.4 cm.) from, the source (a Model DRS-111 Deco Ray Conveyorized Ultraviolet Curing System, sold by Fusion UV Curing Systems, 7600 Standish Place, Rockville, Md. 20855-2798), which serves to cure adhesive layer 20.

After curing, the web of imaging medium is passed through a slitting station where edgewise trimming along both edges of the medium is performed in the machine direction. The resultant trimmed web is then wound onto a take-up roll.

Individual sheets of the thermal imaging medium are cut from the resultant roll and imaged by laser exposure through the 1.75 mil sheet using high intensity semiconductor laser exposure through the 1.75 mil sheet Coy scanning of the imaging medium orthogonally to the direction of the dram rotation). The exposed imaging medium is removed from the dram and the two sheets of the imaging medium are separated to provide a first transparent binary image on the first sheet and a second (and complementary) transparent binary image on the second sheet (the principal image).

Example 4

A reflective overcoat-releasing laminate is prepared having a support layer (i.e., carrier web) of 0.92 mil (23 μm) smooth poly(ethylene terephthalate), a release layer of polymeric wax (0.2 μm Wax Emuls from Michelman), a 2 μm thick durable layer of UV-curable acrylic polymer, a 2 μm thick aqueous reflection layer (cf., a transitional layer), and a 2 μm thick adhesive layer of a hot-melt adhesive (Bostik 7942). The aqueous reflection layer is made according to the following formulation: Rhoplex HG44M (46.48% wt., a polymer latex available from Rohm and Haas), $TiO_2$ (8.96% wt.), Miranol (0.41% wt., an amphoteric surfactant from Miranol Chemical Co.), Tamol 731 (0.48% wt., an anionic surfactant made from a sodium salt of polymeric carboxylic acid marketed by Rohm and Haas), and deionized water (44.08% wt.).

The sequential coating of the several layers is followed by post-coat curing with UV irradiation (about 275–825 mJ/cm$^2$) from the poly(ethylene terephthalate) carrier web side. In coating each layer, the sheet is dried for 10 minutes in a hood then placed for 5 minutes in a 70° C. oven.

In a Talboy laminator, the overcoat-releasing laminate is brought into interfacial contact with a recipient binary image (i.e., prepared in accord with the method for making binary image "B" set forth above) such that the adhesive layer of the overcoat-releasing laminate is in contact with the exposed image surface of the recipient binary image. The overcoat-releasing laminate and the binary image are then subjected to heat and pressure in the laminator (set at 250° F. with a speed of about ½ inches/second and a pressure setting of about 70 lbs./inch). Following lamination, the carrier web is removed by hand peeling.

Example 5

The procedure of Example 4 is followed except that the aqueous reflection layer is replaced by a solvent-based pigment layer prepared according to the following formulation: NeoCryl B-728 (20.90% wt., available from ICI Resins), TiO2 (8.96% wt.), Silwet 7604 (0.15% wt.), and methylethyl ketone (70.00% wt.).

Examples 6 and 7

The procedure for Example 4 and 5 are followed for Examples 6 and 7, respectively, with the modification that the curing by the UV irradiation occurs after the deposition of the reflection layer and before the deposition of the hot-melt adhesive.

Comparative Examples 8 and 9

The procedures for Examples 1 and 2 are followed for Examples 8 and 9, respectively, with the modification that the curing by the UV irradiation occurs after the deposition of the durable layer and before the deposition of both the reflection layer and the hot-melt adhesive.

Evaluations

To evaluate durability, samples prepared in accord with Examples 4–7, and Comparative Example 8–9 were tested under the following protocols:

a. Isopropanol Double Rubs: The media having thereon laminated a reflective protective overcoat is rubbed with an isopropanol soaked paper towel with moderate hand pressure.

b. Isopropanol Droll Penetration: One drop of isopropanol is placed on the tested media for 5 minutes. Any defect on the film is recorded as Fail.

c. Finger Nail Scratch Test: The tested media is scratched back and forth with a finger nail at moderate pressure. Reflective protective overcoats which are scratched through are rated as Fail. Those which are not scratched through are rated as Pass.

d. Tape-Tearing Resistance: As described above, for Examples 1–2.

Each sample prepared in accord with Examples 4–9 displayed good results under the Isopropanol Double Rub Test, the Isopropanol Drop Penetration Test, the Fingernail Scratch Test, and the Tape-Tearing Test.

For samples prepared in accord with Examples 4–7, the reflective protective overcoat transferred with the adhesive onto the transparent binary image. For samples prepared in accord with Comparative Examples 8–9, the durable layer of the reflective protective overcoat frequently did not transfer to the transparent binary image, but rather, remained with the wax and carrier web. Generally, the reflective protective overcoat separated between the durable and pigmented layers.

We claim:

1. An overcoat-releasing laminate capable of being applied thermally onto a substantially planar surface and of being separated therefrom, with transfer of a protective overcoat to said planar surface, the overcoat-releasing laminate comprising in order:

a carrier web comprising a flexible sheet material carrying a release layer; and a transferable protective overcoat comprising a durable layer and an adhesive layer;

said release layer between said durable layer and said flexible sheet material being configured such that, upon thermal application of the overcoat-releasing laminate onto a planar surface and subsequent separation therefrom, separation between the transferable protective overcoat and the carrier web is accomplished by adhesive or cohesive failure of said release layer;

said durable layer being incorporated into the overcoat-releasing laminate from a photocurable composition, the photocurable composition comprising a macromolecular organic binder, a photopolymerizable monomer, and an ultraviolet-activated photoinitiator, wherein the photocurable composition is cured to provide said durable layer by polymerization of the photopolymerizable monomer by exposure to ultraviolet radiation;

said durable layer and said adhesive layer being firmly interconnected at an interface, the firm interconnection being the result of polymerization of the photopolymerizable monomer by exposure to said ultraviolet radiation;

said adhesive layer being thermally activatable to effect thermal application of the overcoat-releasing laminate onto said planar surface at an adhesivity greater than the affinity of the protective overcoat to said carrier web, whereby failure of said release layer and transfer of the transferable protective overcoat is effected when said carrier web of the laminate is separated from said planar surface.

2. The overcoat-releasing laminate of claim 1, wherein the photopolymerizable monomer is a multifunctional monomer.

3. The overcoat-releasing laminate of claim 2, wherein said multifunctional monomer is pentaerythritol triacrylate.

4. The overcoat-releasing laminate of claim 3, wherein the macromolecular organic binder is polymethylmethacrylate.

5. The overcoat-releasing laminate of claim 1, wherein the release layer is prepared from a release layer formulation substantially insoluble in said durable layer formulation.

6. The overcoat-releasing laminate of claim 5, wherein the release layer formulation is a silicone-based formulation.

7. The overcoat-releasing laminate of claim 6, wherein said flexible sheet material is made from poly(ethylene terephthalate).

8. The overcoat-releasing laminate of claim 1, wherein the overcoat-releasing laminate consists essentially of the carrier web, the durable layer, and the adhesive layer.

9. A method for making an overcoat-releasing laminate, the overcoat-releasing laminate comprising a carrier web with a release layer, a durable layer, and at least one overlying layer, the method comprising the steps of:

depositing a liquid release layer formulation onto a carrier web, the carrier web comprising a flexible sheet material, the release layer being substantially insoluble in a liquid durable layer formulation, the liquid release layer formulation allowed to dry to form a dry release layer on the carrier web;

depositing the liquid durable layer formulation onto the dry release layer, the durable layer formulation being a photocurable composition comprising a macromolecular organic binder, a photopolymerizable monomer, and an ultraviolet-activated photoinitiator, the photocurable composition capable of being cured by polymerization of the photopolymerizable monomer by exposure to ultraviolet radiation, the durable layer formulation allowed to dry to form a substantially durable layer overlying the release layer;

depositing a liquid overlying layer formulation onto the substantially dry durable layer, allowing the overlying layer formulation to dry to form a dry overlying layer; and subsequently curing the durable layer through the overlying layer, whereby the durable layer and the overlying layer become firmly interconnected at their interface.

10. The method of claim 9, wherein the overlying layer formulation is an adhesive layer formulation, and whereby the dry overlying layer is a dry adhesive layer.

11. The method of claim 10, wherein the overlying layer formulation is a reflective layer formulation, and whereby the dry overlying layer formulation is a dry reflective layer.

12. The method of claim 11, further comprising the step of:

depositing a liquid adhesive layer formulation over the dry reflective layer, the liquid adhesive layer allowed to dry to form a dry adhesive layer overlying the reflective layer.

13. The method of claim 12, wherein said curing of said durable layer formulation occurs subsequent to the deposition of the adhesive layer formulation onto the dry reflective layer.

14. The method of claim 9, wherein the photopolymerizable monomer is a multifunctional monomer.

15. The method of claim 14, wherein the multifunctional monomer is trimethylolpropane triacrylate.

16. The method of claim 15, wherein the macromolecular organic binder is pentaerythritol triacrylate.

17. The method of claim 16, wherein the liquid release layer formulation is a silicone-based formulation.

18. The method of claim 17, wherein said flexible sheet material is made from poly(ethylene terephthalate).

* * * * *